US006785346B1

United States Patent
Birkett et al.

(10) Patent No.: US 6,785,346 B1
(45) Date of Patent: Aug. 31, 2004

(54) COMPLEX PHASE-LOCKED LOOP DEMODULATOR FOR LOW-IF AND ZERO-IF RADIO RECEIVERS

(75) Inventors: Neil Birkett, Richmond (CA); Norm Filiol, Ottawa (CA); Thomas Riley, Osgoode (CA)

(73) Assignee: Skyworks Solutions, Inc., Irvine, CA (US)

(*) Notice: Subject to any disclaimer, the term of this patent is extended or adjusted under 35 U.S.C. 154(b) by 706 days.

(21) Appl. No.: 09/676,233

(22) Filed: Sep. 29, 2000

(51) Int. Cl.$^7$ .............................. H03D 3/18; H03D 3/24
(52) U.S. Cl. ....................... 375/327; 329/304; 375/329; 375/156
(58) Field of Search ................................. 329/304, 336, 329/323, 341; 325/324; 375/327

(56) References Cited

U.S. PATENT DOCUMENTS

| | | | | |
|---|---|---|---|---|
| 4,090,145 A | * | 5/1978 | Webb | 329/323 |
| 4,599,743 A | | 7/1986 | Reed | 455/207 |
| 4,852,123 A | | 7/1989 | Bickley et al. | 375/9 |
| 5,222,144 A | | 6/1993 | Whikehart | 381/15 |
| 5,703,527 A | * | 12/1997 | Iwasaki | 329/336 |
| 6,310,513 B1 | * | 10/2001 | Iemura | 329/304 |

OTHER PUBLICATIONS

Bicevskis—Complex–Valued Phase–Locked Loops—Sep. 1986—Thesis submitted to University of Toronto Canada.
Crawford—Frequency Synthesizer Design Handbook—1994 Artech House, Inc.—pp. 308–343.
Meyer and Wong—Blocking and Desensitization in RF Amplifiers—IEEE Journal of solid State Circuits, vol. 30, No. 8—Aug. 1995, pp. 944–946.

Abidi—Direct–Conversion Radio Transceivers for Digital Communications—IEEE Journal of Solid–State Circuits vol. 30, No. 12, Dec. 1995, pp. 1399–1410.

Song and Lee—A Digital FM Demodulator for FM, TV, and Wireless—IEEE Trnasactions on Circuits and Systems–II: Analog and Digital Signal Processing, vol. 42, No. 12, Dec. 1995, pp. 821–825.

Park, et al.—A 5–MHz IF Digital FM Demodulator—IEEE Journal of Solid–State Circuits, vol. 34, No. 1, Jan. 1999, pp. 3–11.

* cited by examiner

*Primary Examiner*—Shuwang Liu
*Assistant Examiner*—Eva Zheng
(74) *Attorney, Agent, or Firm*—Gardner Groff, P.C.

(57) ABSTRACT

A digital demodulator which coherently demodulates a low-IF or zero-IF complex signal using a complex-valued phase-locked loop (CPPL). The CPPL includes a numerical controlled oscillator, four multipliers and two combiners to provide independent phase/frequency and amplitude outputs. The CPLL exhibits in first order PLL dynamics without a loop filter in the feedback loop to the NCO. However a filter with one or more poles may be included in the feedback circuit to exhibit $2^{nd}$ or higher order PLL dynamics. The CPLL allows coherent demodulation of extremely low FM modulation indexes whereby the incoming frequency drift may be larger than the frequency deviation. It can also be used to coherently demodulate signals which have combined amplitude and phase characteristics.

5 Claims, 1 Drawing Sheet

COMPLEX PHASE-LOCKED LOOP DEMODULATOR FOR LOW-IF AND ZERO-IF RADIO RECEIVERS

FIELD OF THE INVENTION

The invention relates generally to phased-locked loop demodulators, and more particularly to a complex digital phase-locked loop demodulator.

BACKGROUND OF THE INVENTION

Phase-locked loop demodulators that are capable of demodulating low IF signals are presently available. These devices convert the RF carrier to the I and Q quadrature components at low IF which are processed in a phase-locked loop. An example of such a demodulator is described in U.S. Pat. No. 4,852,123 which issued on Jul. 25, 1989 to Bickley et al.

These demodulators are generally unstable as the IF nears zero-IF. In addition, these circuits which include loop filters as well as a voltage controlled oscillator with further filters and mixers to drive the phase-locked loop, are quite complicated.

Therefore, there is a need for a simpler coherent FM demodulator in low-IF or zero-IF for radio receiver architectures. In addition, it is desirable to coherently demodulate FM signals with extremely low modulation indexes and significant centre frequency offset even when such offsets are several times greater than the maximum FM modulation deviation.

SUMMARY OF THE INVENTION

The invention is directed to a complex demodulator for demodulating a received RF signal converted to digital I and Q components of the IF signal comprising a numerically controlled oscillator (NCO), four digital multipliers each having a first input, a second input and an output, a difference combiner and a summing combiner that are formed into a complex phase locked loop. The numerically controlled oscillator (NCO) generate first and second output signals that are in quadrature and centred at the IF frequency. The digital I IF signal is coupled to the first input of each of the first and third multipliers and the digital Q IF signal is coupled to the first input of each of the second and fourth multipliers. The first NCO output signal is coupled to the second input of the first and fourth multipliers while the second NCO output signal is coupled second input of the second and third multipliers. The outputs of the first and second multipliers are coupled to the difference combiner to provide a phase output while the outputs of the third and fourth multipliers are coupled to the summing combiner to provide an amplitude output. The phase output is also coupled through a feedback loop to the NCO.

In accordance with another aspect of the invention, the complex demodulator may further include a loop filter in the feedback loop between the output of the difference combiner and the NCO. The filter may be a single pole filter to produce a second order loop or have two or more poles to produce a third or higher order loop.

Regarding another aspect of the invention, the NCO first output signal may be a sine signal and the NCO second output signal may be cos signal.

Other aspects and advantages of the invention, as well as the structure and operation of various embodiments of the invention, will become apparent to those ordinarily skilled in the art upon review of the following description of the invention in conjunction with the accompanying drawings.

BRIEF DESCRIPTION OF THE DRAWING

The invention will be described with reference to the accompanying drawings, wherein.

DETAILED DESCRIPTION OF THE INVENTION

Figure 1:
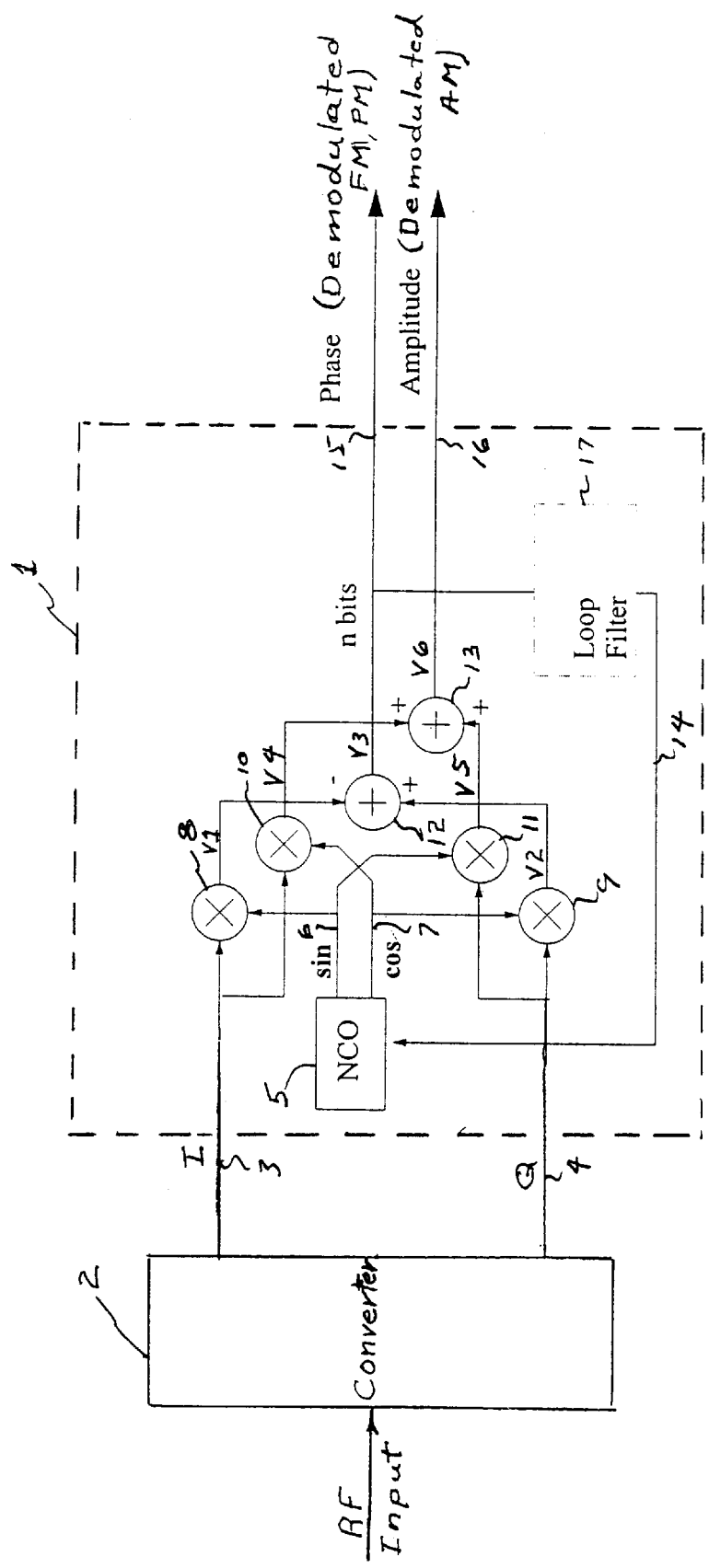
FIG. 1 is a diagram showing a complex digital phase locked loop demodulator in accordance with this invention.

A complex demodulator 1 in accordance with the present invention is illustrated in FIG. 1. Connected to the demodulator 1 is a conversion circuit 2 which receives the input RF signal and converts it to an IF signal in the form of digital in-phase I and quadrature Q components. These components are applied to the demodulator 1 on lines 3 and 4.

The conversion circuit 2 may take any conventional form such as by applying the input RF signal to two local oscillator mixers which are further inputted by two local oscillator signals that are in quadrature. The outputs from the local oscillator mixers are coupled to two analog to digital converters (ADC) to produce the digital I and Q IF signals. In an alternate system, the RF signal is converted to an analog IF signal by an analog mixer and filter and then the IF signal is converted by an ADC to a digital IF signal. The digital IF signal is then applied to a pair of digital multipliers which will produce the digital I and Q IF signals when oscillator signals in quadrature are applied to the digital multipliers.

The demodulator 1 in accordance with the present invention includes a numerically controlled oscillator 5, also known as a direct digital synthesizer which generates a pair of signals that are in quadrature on its outputs 6 and 7. The fundamentals of direct digital synthesizers are described in the manual "Frequency Synthesizer Design Handbook" by James A. Crawford published by Artech House, Inc. in 1994—ISBN 0-89006-440-7, section 7.3, pp 308–343. The centre frequency of the quadrature signals is at the same frequency as the IF signals applied to lines 3 and 4. The demodulator 1 further includes a first digital multiplier 8 with a first input coupled to line 3 and a second input coupled to line 6, a second digital multiplier 9 with a first input coupled to line 4 and a second input coupled to line 7, a third digital multiplier 10 with a first input coupled to line 3 and a second input coupled to line 7, and a fourth digital multiplier 11 with a first input coupled to line 4 and a second input coupled to line 6. The outputs V1 and V2 of multipliers 8 and 9 are coupled to a digital differential combiner 12 which will provide an output signal V3 equal to the difference between its input signals V1 and V2. The signal V3 represents variations in phase and thus the demodulated FM or PM. Further, the outputs V4 and V5 of multipliers 10 and 11 are coupled to a digital summing combiner 13 which will provide an output signal V6 equal to the sum between its input signals V4 and V5. The signal V6 represents variations in amplitude and thus the demodulated AM. The output signal V3 is also coupled to control NCO 5 through a feedback loop 14.

In operation, the received RF information signal will be converted to digital I and Q components at IF by converter 2 preserving the information on the signal. One characteristic of the demodulator 1 in accordance with the present invention is that it is capable of demodulating a low-IF signal whether the frequency is positive or negative as well as a zero-IF signal.

The I component of the IF signal is multiplied by the NCO 5 sine signal and the Q component is multiplied by the NCO 5 cos signal producing signals V1 and V2. V1 and V2 are subtracted from one another in the difference combiner 12 and provide, at output 15, the phase output V3 of the RF signal. In addition, the signal V3 is used to control the NCO through feed back loop 14. The feedback loop exhibits $1^{st}$ order loop characteristics because of the properties of the NCO 5. However, if it is desired to create $2^{nd}$, $3^{rd}$ or higher order feedback loops for the NCO 5, a single-pole, two-pole or more filter 17 can be inserted into the feedback loop 14.

In addition, the I component of the IF signal is multiplied by the NCO 5 cos signal and the Q component is multiplied by the NCO 5 sine signal producing signals V4 and V5. V4 and V5 are summed in combiner 13 to provide the amplitude component V6 of the RF information signal at output 16.

The advantages of the all digital phase-locked loop demodulator 1 in accordance with the present invention are numerous. Because of its coherence, the NCO will lock to the incoming frequency with little consequence to the demodulation efficiency even if the inputs are at a non-ideal frequency offset.

The demodulator 1 provides an amplitude V6 which is independent of the phase output V3. It is the demodulated AM signal and can be used for a received signal strength indicator (RSSI). Demodulator 1 also provides a phase output V3 which is the demodulated FM or PM signal. For high loop gains, the phase response output of the CPLL demodulator 1 approaches that of an ideal FM discriminator and is therefore attractive at both low and high modulation indexes. Because the outputs V3 and V6 are independent of one another, the circuit may be used as an AM demodulator or FM demodulator, or it can be used to demodulate signals which have combined amplitude and phase characteristics as for example a quadrature modulated signal (QAM).

In addition, the CPLL demodulator 1 is unconditionally stable; it has an acquisition range equivalent to the loop gain since there is no need for a loop filter. Pull-in time will be equivalent to the first order PLL, i.e. phase lock will occur without cycle slipping. It has a fast acquisition time which is inversely proportional to the loop gain; as a result the CPLL demodulator 1 in accordance with the present invention is attractive for applications that demand fast acquisition times.

In addition, the CPLL demodulator 1 can track a signal even if it goes through zero frequency. Thus it will provide both phase and amplitude information as the signal goes through zero frequency.

While the invention has been described according to what is presently considered to be the most practical and preferred embodiments, it must be understood that the invention is not limited to the disclosed embodiments. Those ordinarily skilled in the art will understand that various modifications and equivalent structures and functions may be made without departing from the spirit and scope of the invention as defined in the claims. Therefore, the invention as defined in the claims must be accorded the broadest possible interpretation so as to encompass all such modifications and equivalent structures and functions.

What is claimed is:

1. A complex demodulator for demodulating an RF signal converted to digital I and Q IF signals, the complex demodulator comprising:

a numerically controlled oscillator (NCO) for generating first and second output signals in quadrature centred at the IF frequency;

a first digital multiplier having a first input for receiving the digital I IF signal, a second input for receiving the first NCO output signal and an output;

a second digital multiplier having a first input for receiving the digital Q IF signal, a second input for receiving the second NCO output signal and an output;

a difference combiner coupled to the outputs of the first and second digital multipliers for providing a phase signal at its output, the phase signal being coupled to the NCO through a feedback loop to control the NCO frequency, a third digital multiplier having a first input for receiving the digital I IF signal, a second input for receiving the second NCO output signal and an output;

a fourth digital multiplier having a first input for receiving the digital Q IF signal, a second input for receiving the first NCO output signal and an output; and a sum combiner coupled to the outputs of the third and fourth digital multipliers for providing an amplitude signal at its output.

2. A demodulator as claimed in claim 1 wherein the first NCO output signal is a sine signal and the second NCO output signal is a cos signal.

3. A demodulator as claimed in claim 2 further comprising a loop filter in the feedback loop between the output of the difference combiner and the NCO.

4. A demodulator as claimed in claim 3 wherein the filter is a signal pole filter to produce a second order loop.

5. A demodulator as claimed in claim 3 wherein the filter is a two or more pole filter to produce a third or higher order loop.

* * * * *

UNITED STATES PATENT AND TRADEMARK OFFICE
CERTIFICATE OF CORRECTION

| | | |
|---|---|---|
| PATENT NO. | : 6,785,346 B1 | Page 1 of 1 |
| APPLICATION NO. | : 09/676233 | |
| DATED | : August 31, 2004 | |
| INVENTOR(S) | : Birkett et al. | |

It is certified that error appears in the above-identified patent and that said Letters Patent is hereby corrected as shown below:

Title page item [63]
Before the FIELD OF THE INVENTION paragraph in the specification, please add the following paragraph:

CROSS-REFERENCE TO RELATED APPLICATIONS
The benefit of the filing dates of Canadian patent application Serial No. 2,284,948 filed October 4, 1999 is hereby claimed, and the specification thereof is incorporated herein by this reference.

Signed and Sealed this

Eighth Day of August, 2006

JON W. DUDAS
*Director of the United States Patent and Trademark Office*